(12) United States Patent
Granados et al.

(10) Patent No.: US 8,535,393 B2
(45) Date of Patent: Sep. 17, 2013

(54) METHOD AND APPARATUS FOR MEASUREMENT AND CONTROL OF PHOTOMASK TO SUBSTRATE ALIGNMENT

(75) Inventors: Axel Aguado Granados, Rochester, MN (US); Benjamin Aaron Fox, Rochester, MN (US); Nathaniel James Gibbs, Rochester, MN (US); Andrew Benson Maki, Rochester, MN (US); John Edward Sheets, II, Zumbrota, MN (US); Trevor Joseph Timpane, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 432 days.

(21) Appl. No.: 12/983,915

(22) Filed: Jan. 4, 2011

(65) Prior Publication Data

US 2011/0096329 A1 Apr. 28, 2011

Related U.S. Application Data

(62) Division of application No. 12/026,763, filed on Feb. 6, 2008, now Pat. No. 7,935,546.

(51) Int. Cl.
*H01L 21/027* (2006.01)

(52) U.S. Cl.
USPC ........................................................ 29/25.01

(58) Field of Classification Search
USPC ........................................................ 29/25.01
See application file for complete search history.

(56) References Cited

U.S. PATENT DOCUMENTS

| | | | |
|---|---|---|---|
| 4,079,405 A | 3/1978 | Ohuchi et al. | |
| 4,087,833 A * | 5/1978 | Tseng | 257/230 |
| 4,282,541 A * | 8/1981 | Tsang | 257/458 |
| 4,551,394 A | 11/1985 | Betsch et al. | |
| 4,703,437 A | 10/1987 | Nishimura | |
| 5,222,175 A * | 6/1993 | Tatoh | 385/93 |
| 5,252,851 A | 10/1993 | Mita et al. | |
| 5,305,233 A | 4/1994 | Kawagoe et al. | |
| 5,315,104 A * | 5/1994 | Plumb | 250/214.1 |
| 5,315,148 A | 5/1994 | Fujimura | |
| 5,418,396 A | 5/1995 | Mita | |
| 5,444,637 A | 8/1995 | Smesny et al. | |
| 5,525,828 A * | 6/1996 | Bassous et al. | 257/457 |
| 6,002,142 A * | 12/1999 | Paoli | 257/21 |
| 6,194,109 B1 | 2/2001 | Lawton | |
| 6,239,422 B1 * | 5/2001 | Vang et al. | 250/208.2 |
| 6,509,195 B1 * | 1/2003 | De Rooij et al. | 436/172 |

(Continued)

OTHER PUBLICATIONS

Notice of Allowance (Mail Date Dec. 23, 2010) for U.S. Appl. No. 12/026,763, filed Feb. 6, 2008; Confirmation No. 3637.

(Continued)

*Primary Examiner* — George Fourson, III
(74) *Attorney, Agent, or Firm* — Schmeiser, Olsen & Watts

(57) ABSTRACT

A method, structure, system of aligning a substrate to a photomask. The method includes: directing incident light through a pattern of clear regions transparent to the incident light in an opaque-to-the-incident-light region of a photomask, through a lens and onto a photodiode formed in a substrate, the photodiodes electrically connected to a light emitting diode formed in the substrate, the light emitting diode emitting light of different wavelength than a wavelength of the incident lights; measuring an intensity of emitted light from light emitting diode; and adjusting alignment of the photomask to the substrate based on the measured intensity of emitted light.

21 Claims, 10 Drawing Sheets

(56) References Cited

U.S. PATENT DOCUMENTS

| | | |
|---|---|---|
| 6,593,636 B1 | 7/2003 | Bui et al. |
| 7,935,546 B2* | 5/2011 | Granados et al. ............... 438/7 |
| 2001/0007359 A1* | 7/2001 | Ogihara et al. ............... 257/88 |
| 2006/0001032 A1 | 1/2006 | Murofushi et al. |
| 2006/0249789 A1* | 11/2006 | Deliwala ............... 257/347 |
| 2008/0111205 A1* | 5/2008 | Miura ............... 257/440 |
| 2009/0195787 A1 | 8/2009 | Granados et al. |
| 2010/0154876 A1* | 6/2010 | Camalleri et al. ............ 136/255 |
| 2010/0237344 A1* | 9/2010 | Schoenfeld ............... 257/43 |
| 2011/0096310 A1* | 4/2011 | Granados et al. ............... 355/40 |
| 2011/0096329 A1* | 4/2011 | Granados et al. ............... 356/401 |

OTHER PUBLICATIONS

U.S. Appl. No. 12/983,591, filed Jan. 3, 2011; Confirmation No. 1695.

* cited by examiner

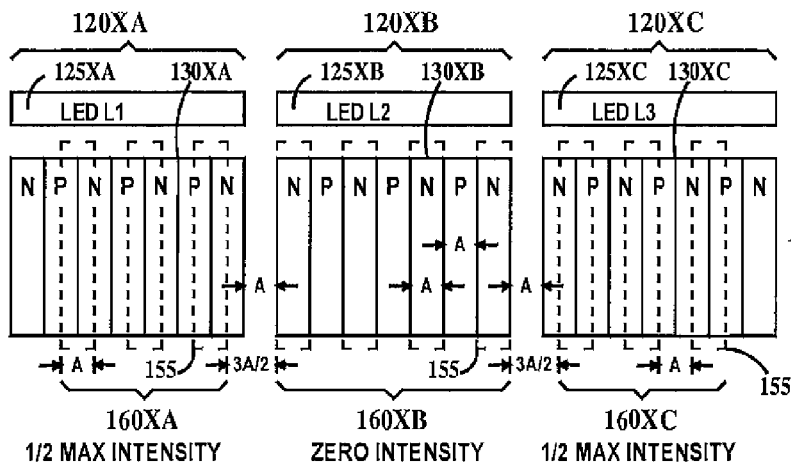
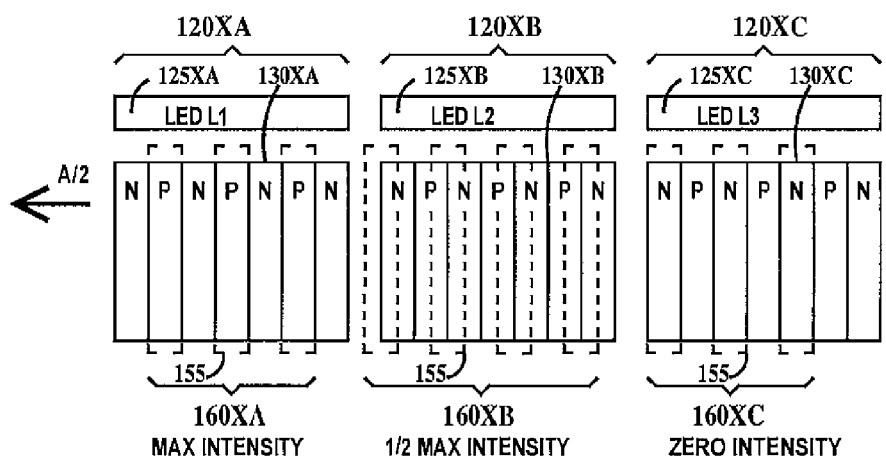
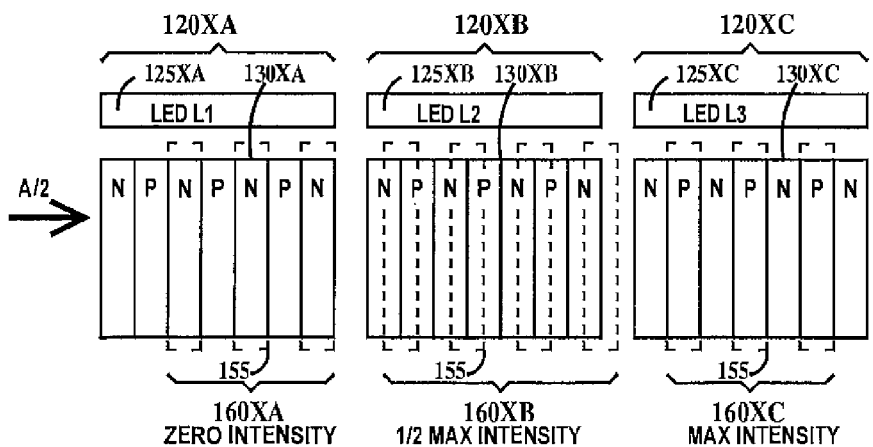
FIG. 7A
FIG. 7B
FIG. 7C

METHOD AND APPARATUS FOR MEASUREMENT AND CONTROL OF PHOTOMASK TO SUBSTRATE ALIGNMENT

The present application is a division of U.S. patent application Ser. No. 12/026,763 filed on Feb. 6, 2008.

FIELD OF THE INVENTION

The present invention relates to the field of optical photolithography; more specifically, it relates to a structure and method for determining and adjusting photomask and lens to wafer alignment in an optical photolithography system.

BACKGROUND OF THE INVENTION

Current optical photolithographic techniques are unable to use light with a wavelength below 193 nm because fused silica (silicon dioxide) of conventional mask substrates is opaque to wavelengths below 193 nm. Substrate materials that are transparent to light with a wavelength below 193 nm have high thermal coefficients of expansion compared to silicon dioxide and thus expand and contract far too much to be used reliably in sub-193 nm lithography. While some schemes have been proposed to overcome this problem for those fabrication levels commonly referred to as front-end-of-line (FEOL) which are substrate level, there are no schemes for overcome this problem for those fabrication levels commonly known as back-end-of-line (BEOL) fabrication levels which are interconnection/wiring levels. Because the minimum feature size printable in an optical photolithography system is a function of the wavelength of the actinic radiation (shorter wavelengths allowing smaller feature sizes) it would be useful to the industry to overcome the deficiencies and limitations described hereinabove.

SUMMARY OF THE INVENTION

A first aspect of the present invention is a method; comprising: directing incident light through a pattern of clear regions transparent to the incident light in an opaque-to-the-incident-light region of a photomask, through a lens and onto a photodiode formed in a substrate, the photodiode electrically connected to a light emitting diode formed in the substrate, the light emitting diode emitting light of different wavelength than a wavelength of the incident light; measuring an intensity of emitted light from the light emitting diode; and adjusting alignment of the photomask to the substrate based on the measured intensity of emitted light.

A second aspect of the present invention is a structure, comprising: one or more alignment monitors formed in a substrate and arranged in a row in a first direction, each alignment monitor of the one or more alignment monitors comprising a respective photodiode electrically connected to a respective light emitting diode, each respective light emitting diode configured to emit a different wavelength of light, each respective photodiode comprising first regions of the substrate that emit electrons when struck by incident light interdigitated with second regions of the substrate that do not emit electrons when struck by the incident light.

A third aspect of the present invention is an apparatus for aligning a semiconductor substrate to a photomask, the substrate including an array of light emitting diodes, each light emitting diode of the array of light emitting diodes configured to emit light in a different range of wavelengths, comprising: an X-Y-θ stage configured to hold the semiconductor substrate; a light source; a lens; a mask holder configured to hold the photomask between the light source and lens; a slit between the mask holder and the lens; means for aligning alignment targets on the substrate to alignment marks on the photomask; means for directing incident light onto the substrate; means for measuring intensities of light, emitted from the array of light emitting diodes, in different wavelength ranges; and a sub-system configured to direct temperature controlled gas (i) over the photomask based on signals received from the means for measuring intensities of light (ii), over the lens based on the signals received from the means for measuring intensities of light, or (iii) over both the photomask and the lens based on the signals received from the means for measuring intensities of light.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIGS. 7A through 7C are top views illustrating an example of how the embodiments of the present invention can distinguish between degrees of alignment between a wafer and a corresponding photomasks;

DETAILED DESCRIPTION OF THE INVENTION

Figure 1:
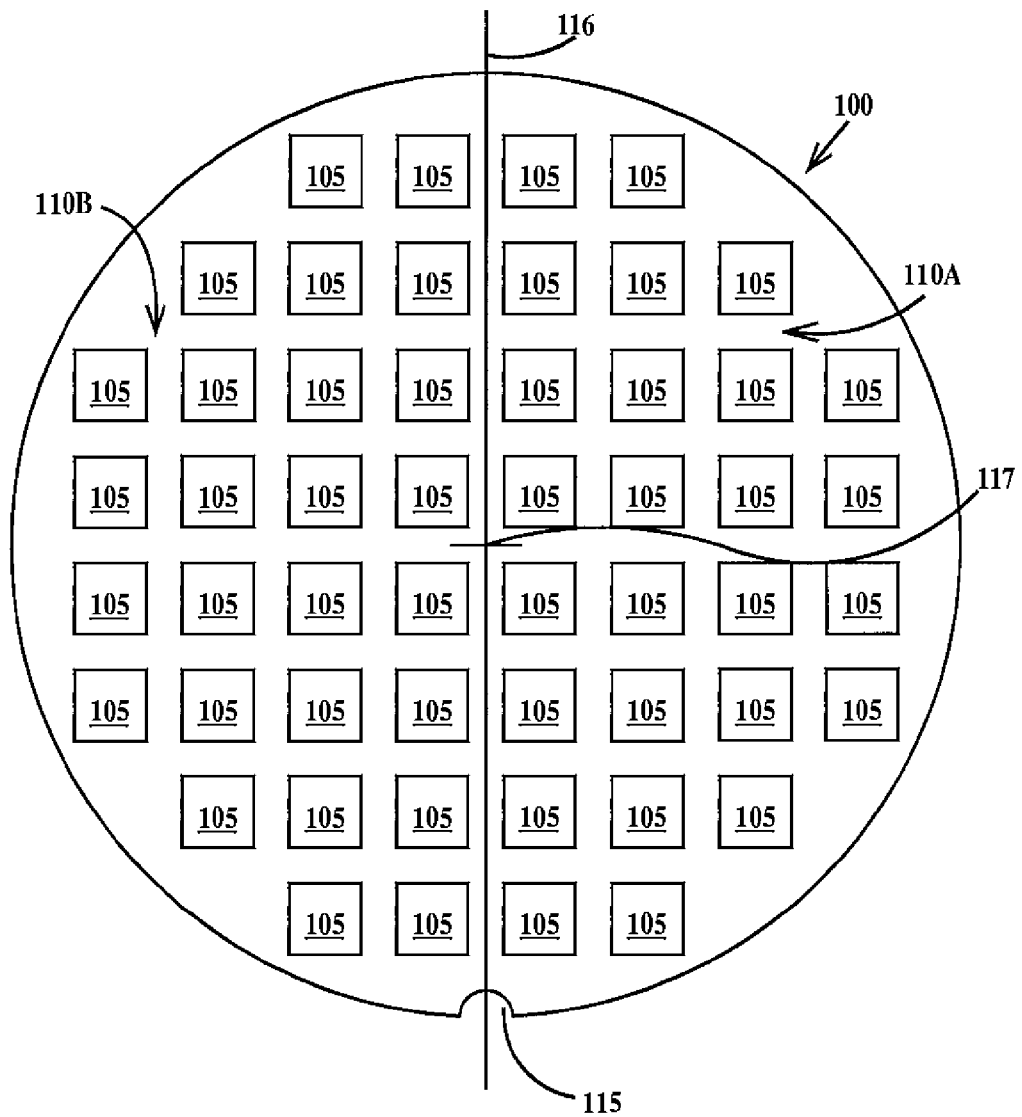
FIG. 1 is a top view of an exemplary integrated circuit wafer on which the embodiments of the present invention may be practiced.

FIG. 1 is a top view of an exemplary integrated circuit wafer on which the embodiments of the present invention may be practiced. It is common practice to fabricate multiple integrated circuit chips simultaneously on thin, disc shaped semiconductor substrates called wafers. Common wafer diameters are 100 mm, 200 mm and 300 mm with thicknesses in the hundreds of micron range. In one example, wafers consist of single-crystal silicon. In one example, wafers comprise an upper single crystal silicon layer separated from a lower single-crystal silicon layer by a buried oxide (BOX) layer. These latter wafers are also called silicon-on-insulator (SOI) wafers. After fabrication of the integrated circuit chips is complete, the individual chips are separated in an operation called dicing. In FIG. 1, a wafer 100 includes an array of integrated circuit chips 105 separated by horizontal (X-direction) kerfs 110A and vertical (Y-direction) kerfs 110B. Wafer 100 includes a notch 115 for orientating the wafer in various fabrication systems. There may be several notches. In FIG. 1, a line 116 running from notch 115 through a center 117 of wafer 100 defines the vertical or Y-direction. The horizontal or X-direction is perpendicular to line 116 and in the same plane as line 116. In some wafers, notch 115 is offset from line 116. Kerfs 110A and 110B are also called streets.

Figure 2:
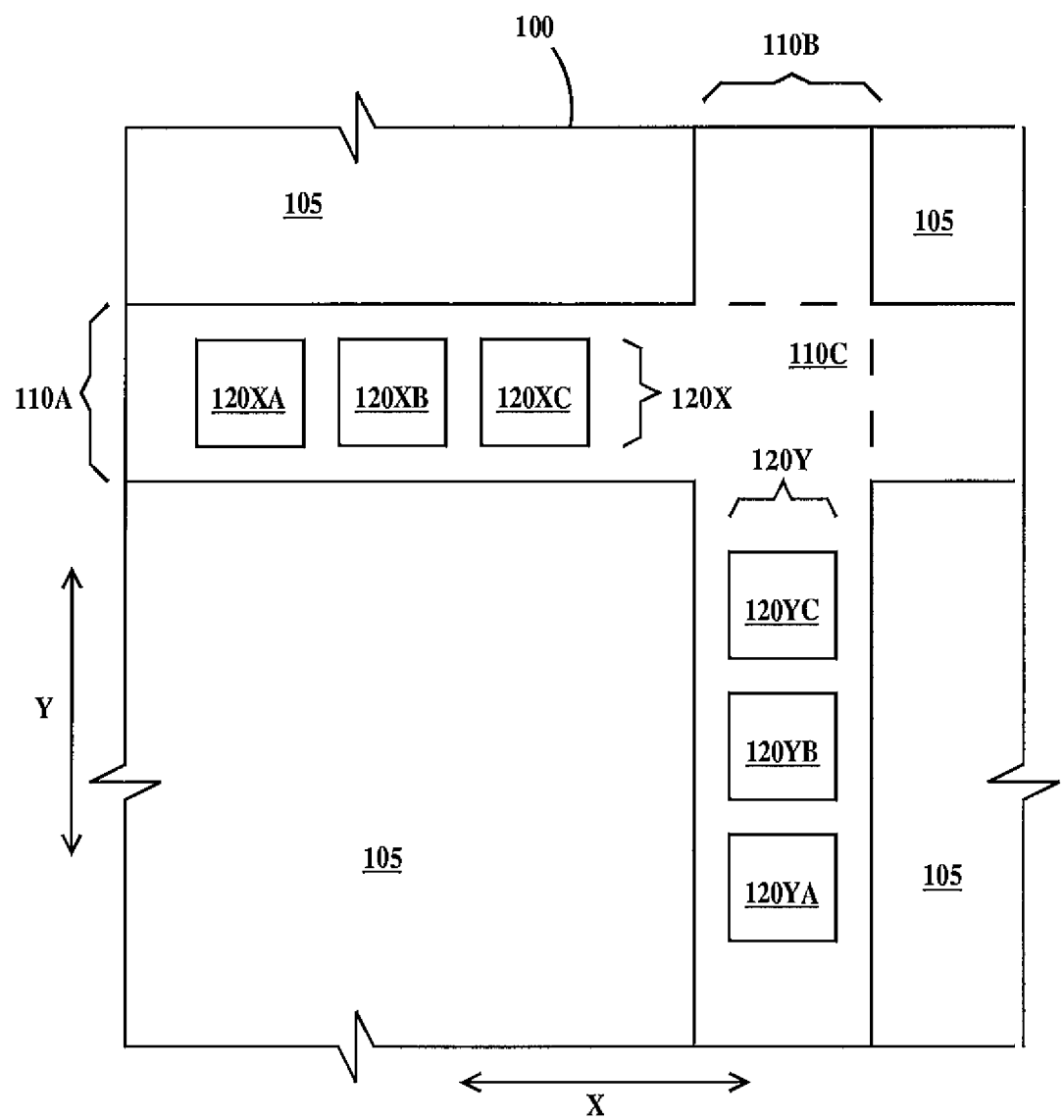
FIG. 2 is a higher magnification view of the wafer of FIG. 1, illustrating positioning of alignment monitors according to the embodiments of the present invention.

FIG. 2 is a higher magnification view of the wafer of FIG. 1, illustrating positioning of alignment monitors according to the embodiments of the present invention. In FIG. 2, only a portion of wafer 100 is illustrated. In FIG. 2, formed in kerf 110A is a first set of alignment monitors 120X comprised of a first alignment monitor device 120XA, a second alignment monitor device 120XB and a third alignment monitor device 120XC. Formed in kerf 110B is a second set of alignment monitors 120Y comprised of a fourth alignment monitor device 120YA, a fifth alignment monitor device 120YB and a sixth alignment monitor device 120YC. The intersection of kerfs 110A and 110B is designated corner 110C.

First set of alignment monitor sets 120X will detect a degree of alignment between a photomask and wafer 100 in the X direction. Second set of alignment monitors 120Y will detect a degree of alignment between the photomask and wafer 100 in the Y-direction as described infra. Alignment monitor sets 120X and 120Y are aids to photolithographic fabrication operations of BEOL levels.

Most modern photolithography systems are step and expose or step and scan systems, in that the photomask used in the system has patterns for less integrated circuit chips than the number that can printed on wafer 100. These photomasks are often called reticles. Exemplary reticles may contain one, two, four or other numbers of chip exposure fields, each chip exposure field containing a chip 105, one kerf 110A, one kerf 110B and one corner 110C. To expose an entire wafer, the wafer is aligned to the mask and exposed, and then the wafer is stepped to another position, aligned to the mask and then exposed again. This is repeated as many times a required to expose all the integrated circuit chip positions on the wafer. There need only be one instance of first and second sets of alignment monitors 120X and 120Y for each region of wafer 100 that is defined by the reticle.

In an alternative arrangement both first set of alignment monitors 120X and second set of alignment monitors are contained in either kerf 110A or 110B or corner 110C. However, first set of alignment monitors 120X remain aligned in a row in the X direction from first alignment monitor device 120XA to second alignment monitor device 120XB to third alignment monitor device 120XC and second set of alignment monitors 120Y remain aligned in a column in the Y direction from fourth alignment monitor device 120YA to fifth alignment monitor device 120YB to sixth alignment monitor device 120YC.

Figure 3:
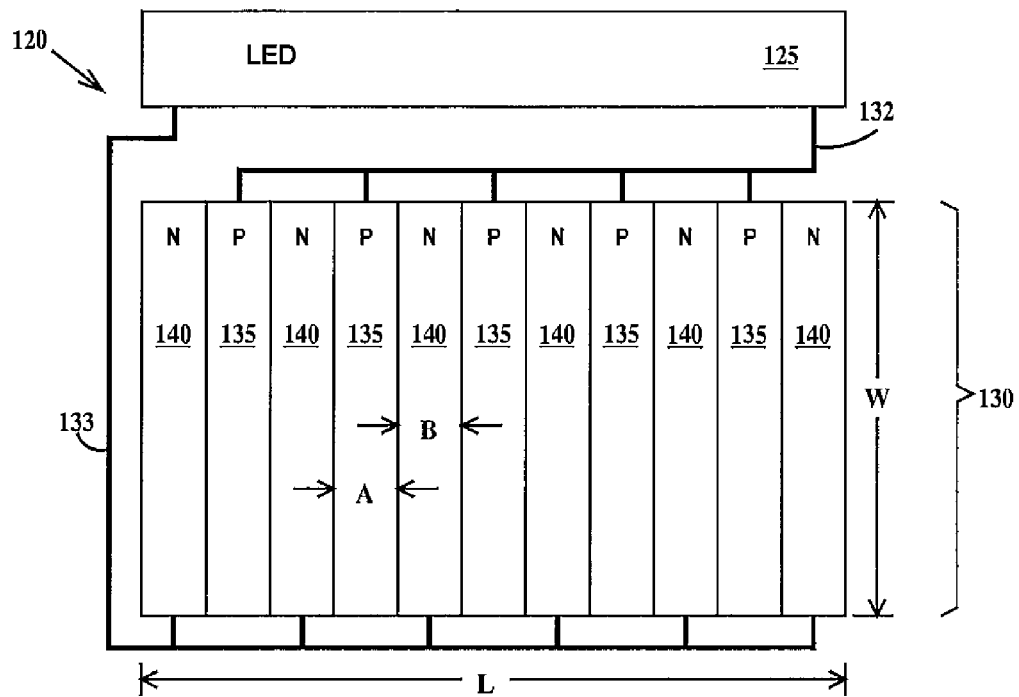
FIG. 3 is a top view of an exemplary alignment structure according to embodiments of the present invention.

FIG. 3 is a top view of an exemplary alignment structure according to embodiments of the present invention. In FIG. 3, an alignment monitor device 120 (which represents each of alignment monitors 120XA, 120XB, 120XC, 120YA, 120YB and 120YC of FIG. 2) comprises a light emitting diode (LED) 125 and a photodiode 130. Photodiode 130 includes P-doped regions 135 interdigitated with N-doped regions 140. In one example, the perimeter of array 130 abuts dielectric isolation. P-doped regions 135 are electrically connected in parallel to a first terminal of LED 125 by wires 132 and N-doped regions 140 are electrically connected in parallel to a second terminal of LED 125 by wires 133. Light striking P-doped regions 135 of photodiode 130 will generate current flow (i.e., electrons) to LED 125 causing the LED to emit light. Light striking N-doped regions 140 of photodiode 130 will not generate current flow to LED 125. It should be noted that no external power source is required for alignment monitors according to the embodiments of the present invention to operate.

An exemplary integrated circuit comprises a semiconductor substrate containing first and second sets of alignment monitors 120X and 120Y and various other devices such as field effect transistors (FETs), bipolar transistors, diodes, capacitors, resistors formed in the substrate and interconnect levels formed in sequence over a top surface of the wafer. In one example, a lowermost (i.e., closest to the wafer) interconnect level is formed from polysilicon (often used to form gates of FETs), a next interconnect level includes metal contacts, and subsequent interconnect levels from a first to a last wiring level include metal wires and metal filled vias for interconnecting the wires in the various wiring layers. The last wiring level is the uppermost (i.e., farthest from the wafer) interconnect level. This structure further described infra with reference to FIGS. 9, 10 and 11. In a preferred embodiment, wires 132 and 133 are formed in the lowermost (polysilicon) level. In another preferred embodiment wires 132 and 133 are formed in the contact level. In still another preferred embodiment wires 132 and 133 are formed in the first wiring level. In order to use the alignment monitors of the embodiments of the present invention on a maximum number of interconnect levels, it is advantageous that the alignment monitors be functional as early in the fabrication process as possible.

Photodiode 130 has a width W and a length L. In one example L is between about 20 microns and about 100 microns. In one example W is between about 10 microns and about 30 microns. P-doped regions 135 have a width (measured in the L direction) of A and N-doped regions 140 have a width B (measured in the L direction). In one example A is equal to B. In one example A is less than B. In one example A and B are each independently between about 30 nm to about 200 nm.

Exemplary photodiodes and methods of manufacture are described in U.S. Pat. No. 5,252,851 to Mita et al., issued Oct. 12, 1993 and U.S. Pat. No. 5,418,396 to Mita, issued May 23, 1995 which is hereby incorporated by reference in their entireties. An exemplary LED and method of manufacture is described in United States Patent Publication 2001/0007359 to Ogihara et al., published Jul. 12, 2001, which is hereby incorporated by, reference in its entity.

Figure 4:
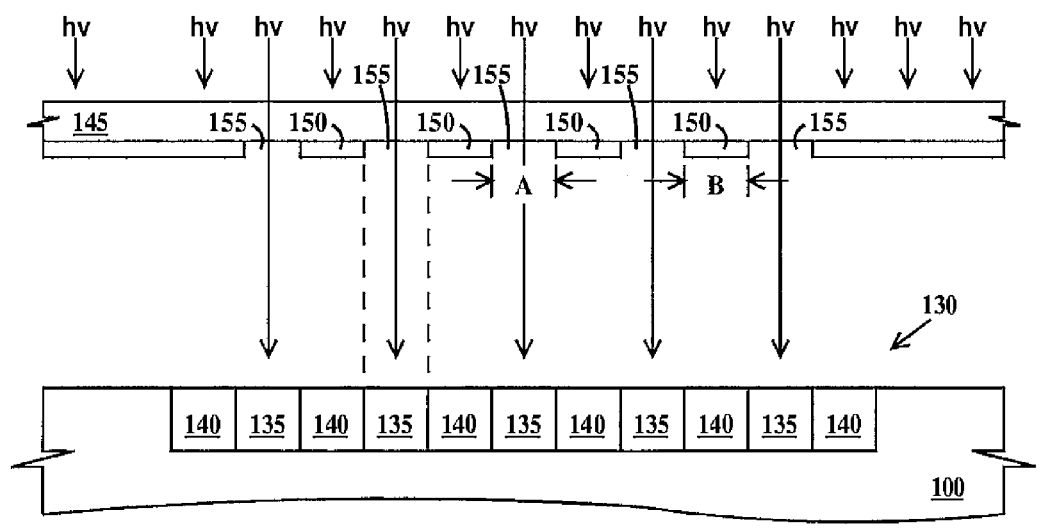
FIGS. 4 and 5 are a cross-sectional views illustrating the relationship between alignment structures and corresponding patterns on photomasks according to embodiments of the present invention.
Figure 5:
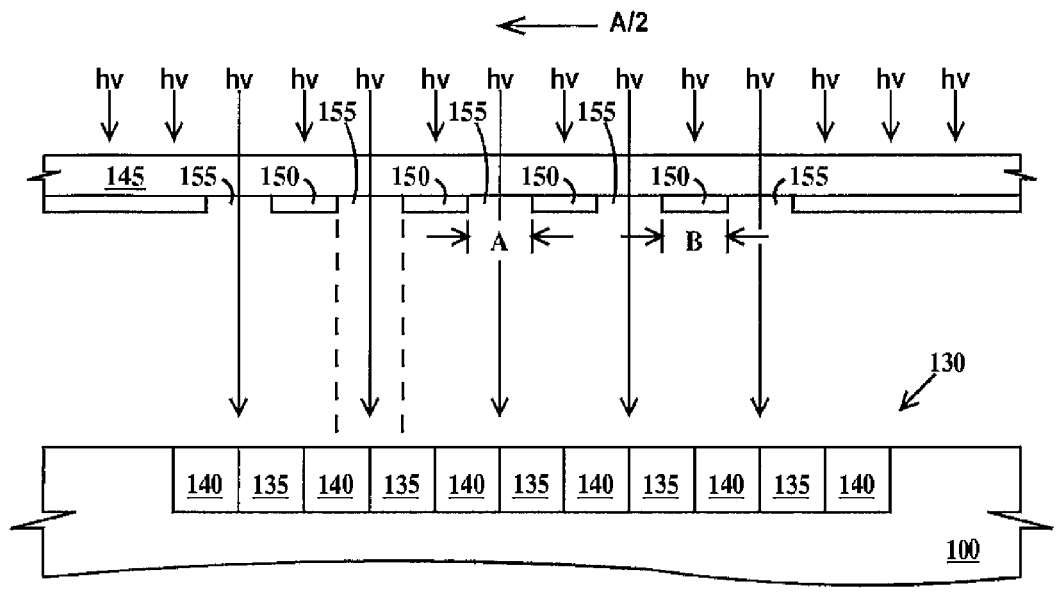

FIGS. 4 and 5 are a cross-sectional views illustrating the relationship between alignment structures and corresponding patterns on photomasks according to embodiments of the present invention. In FIG. 4 a photomask 145 having opaque regions 150 interdigitated by clear regions 155 is aligned perfectly to corresponding N-doped regions 140 and P-doped regions 135 of photodiode 130 (see dashed lines). Light passing through regions 155 strikes P-doped regions 135 but not N-doped regions 140. Thus a maximum amount of current for a fixed light intensity is generated. In FIG. 5, photomask 145 is offset by a distance equal to A/2. Half the light passing through regions 155 strikes P-doped regions 135 and half the light strikes N-doped regions 140 (see dashed lines). Thus only half the maximum amount of current for the fixed light intensity is generated.

It is clear that an alignment monitor on a wafer comprising alternating bands of N-and P-doped regions can be used to measure a degree of misalignment between the wafer and photomask, the photomask having a pattern of alternating clear and opaque regions arranged to correspond in a predetermined manner to the pattern of P-doped and N-doped regions. This is described in more detail infra in reference to FIGS. 7A, 7B and 7C.

Figure 6:
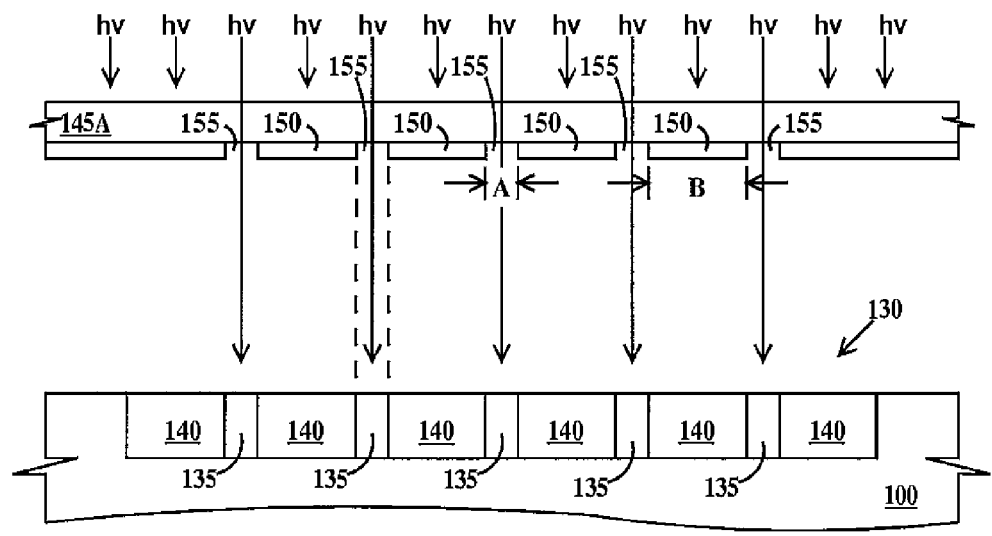
FIG. 6. is a cross-sectional view illustrating the relationship between alignment structures and corresponding patterns on photomasks according to a modified embodiment of the present invention.

FIG. 6. is a cross-sectional view illustrating the relationship between alignment structures and corresponding patterns on photomasks according to a modified embodiment of the present invention. Since light may diffract in passing through regions 155 as of the offset approaches A, large degrees of misalignment (greater than A) will not be distinguishable from very small degrees of misalignment. This effect can be offset by making A can smaller than B as illustrated in FIG. 6. In FIG. 6, B is about 3 times A and perfect mask to wafer alignment is shown. However, even if photomask 145A is offset by more than A (but less than 3A), the next P-doped region will not be struck by light.

FIGS. 7A through 7C are top views illustrating an example of how the embodiments of the present invention can distinguish between degrees of alignment between a wafer and a corresponding photomasks. In FIGS. 7A, 7B, and 7C, the use of first, second and third alignment monitors 120XA, 120XB and 120XC will be described but the description is applicable to fourth, fifth and sixth alignment monitors 120YA, 120YB and 120YC (see FIG. 2) by translation from the X direction to the Y direction by a 90 degree rotation.

In FIG. 7A, the P-doped and N-doped regions (labeled P and N respectively and corresponding to P-doped regions 135 and N-doped regions 140 of FIG. 3) each have widths A measured in the C-direction. Photodiode 130XB is between photodiodes 130XA and 130XC. Photodiode 130XA is spaced a distance A from photodiode 130XB and photodiode 130XC is spaced a distance A from photodiode 130XB, where N is a positive odd integer greater than or equal to 3. In FIG. 7A, first, second and third sets 160XA, 160XB and 160XC of clear regions 155 (dashed boxes) in a photomask are shown. Each clear region 155 has a width A. Adjacent clear regions within each set 160XA, 160XB and 160XC are spaced apart a distance A. Adjacent clear regions 155 from different sets of clear regions are spaced a distance 3 times A/2 apart.

In FIG. 7A, first, second and third sets of clear regions 160XA, 160XB and 160XC and first, second and third photodiodes 130XA, 130XB and 130XC are shown when the photomask and wafer are in perfect alignment. This perfect alignment places clear regions 155 of second set of clear regions 160XB over the N-doped regions but not over the P-doped regions of second photodiode 130XB. Thus no current is generated by photodiode 130XB and LED 125XB emits no light (zero intensity). However, clear regions 155 of first and third set of clear regions 160XA and 160C are aligned respectively over half of the N-doped regions half of the P-doped regions of first and third photodiodes 130XA and 130XC. Thus half the maximum current is generated by photodiodes 130XA and 130XC and LEDs 125XA and 125XC each emit half the maximum amount of light (half maximum intensity).

In FIG. 7B, first, second and third sets of clear regions 160XA, 160XB and 160XC and first, second and third photodiodes 130XA, 130XB and 130XC are shown when the photomask is misaligned a distance A/2 to the left (negative X direction). This negative shift in alignment places clear regions 155 of first set of clear regions 160XA over the P-doped regions but not over the N-doped regions of first photodiode 130XA. Thus the maximum amount of current is generated by photodiode 130XA and LED 125XA emits the maximum amount of light (maximum intensity). Clear regions 155 of second set of clear regions 160XB are placed over half of the N-doped regions half of the P-doped regions of second photodiode 130XB. Thus half the maximum current is generated by photodiode 130XB and LED 125XB emits half the maximum amount of light (half maximum intensity). Clear regions 155 of third set of clear regions 160XC are placed over the N-doped regions but not over the P-doped regions of third photodiode 130XC. Thus no current is generated by photodiode 130XC and LED 125XC emits no light (zero intensity).

In FIG. 7C, first, second and third sets of clear regions 160XA, 160XB and 160XC and first, second and third photodiodes 130XA, 130XB and 130XC are shown when the photomask is misaligned a distance A/2 to the right (positive X direction). This positive shift in alignment places clear regions 155 of first set of clear regions 160XA over the N-doped regions but not over the P-doped regions of first photodiode 130XA. Thus no current is generated by photodiode 130XA and LED 125XA emits no light (zero intensity). Clear regions 155 of second set of clear regions 160XB are placed over half of the N-doped regions half of the P-doped regions of second photodiode 130XB. Thus half the maximum current is generated by photodiode 130XB and LED 125XB emits half the maximum amount of light (half maximum intensity). Clear regions 155 of third set of clear regions 160XC are placed over the P-doped regions but not over the N-doped regions of third photodiode 130XC. Thus the maximum amount of current is generated by photodiode 130XC and LED 125XC emits the maximum amount of light (maximum intensity).

It should be noted that the amount of light generated by first, second and third LEDs 125XA, 125XB and 125XC depends upon the amount and direction of misalignment. Table I shows the fraction of maximum light intensity for a number of exemplary misalignments.

TABLE I

| MISALIGNMENT | LED ONE | LED TWO | LED THREE |
| --- | --- | --- | --- |
| −A/2 | 0 | ½ | 1 |
| −A/4 | ¼ | ¼ | ¾ |
| None | ½ | 0 | ½ |
| +A/4 | ¾ | ¼ | ¼ |
| +A/2 | 1 | ½ | 0 |

It should be understood, that there are very many combinations of P doped region width, N-doped region width, photodiode to photodiode distance and photomask clear region widths, spacings and clear region set to set spacings that may be used besides the specific widths and spacing illustrated in FIG. 7A. It should also be understood that first, second and third photodiodes need to emit different wavelengths of light so the intensities from the different LEDs can be measured independently.

Figure 8:
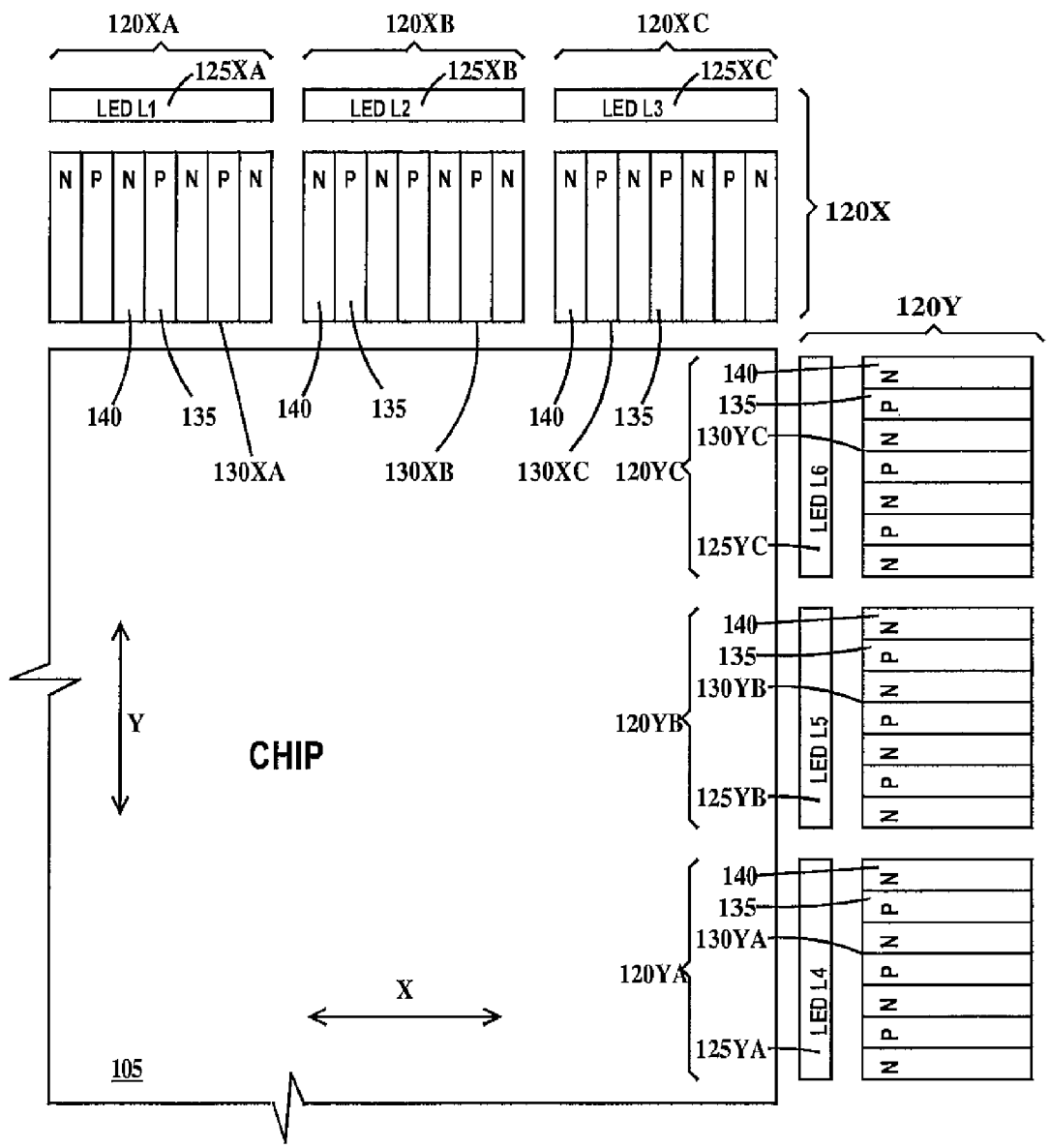
FIG. 8 illustrates the arrangement of components of the six alignment monitors illustrated in FIG. 2.

FIG. 8 illustrates the arrangement of components of the six alignment monitors illustrated in FIG. 2. In FIG. 8, first set of alignment monitors 120X comprise first alignment monitor device 120XA, second alignment monitor device 120XB and a third alignment monitor device 120XC. Second set of alignment monitors 120Y comprises a fourth alignment monitor device 120YA, a fifth alignment monitor device 120YB and a sixth alignment monitor device 120YC. First alignment monitor device 120XA comprises first LED 125XA and first photodiode 130XA and the first photodiode includes interdigitated P-doped regions 135 and N-doped regions 140. Second alignment monitor device 120XB comprises second LED 125XB and second photodiode 130XB and the second photodiode includes interdigitated P-doped regions 135 and N-doped regions 140. Third alignment monitor device 120XC comprises third LED 125XC and third photodiode 130XC and the third photodiode includes interdigitated P-doped regions 135 and N-doped regions 140. Fourth alignment monitor device 120YA comprises a fourth LED 125YA and fourth photodiode 130YA and the fourth photodiode includes interdigitated P-doped regions 135 and N-doped regions 140. Fifth alignment monitor device 120YB comprises a fifth LED 125YA and a fifth photodiode 130YA and the fifth photodiode includes interdigitated P-doped regions 135 and N-doped regions 140. Sixth alignment monitor device 120YC comprises a sixth LED 125YC and sixth photodiode 130YC and the sixth photodiode includes interdigitated P-doped regions 135 and N-doped regions 140.

First, second and third photodiodes 130XA, 130XB and 130XC are arranged in a row in the X direction with the second photodiode between the first and third photodiodes. P-doped regions 135 and N-doped regions 140 of first, second and third photodiodes 130XA, 130XB, 130XC have longitudinal axes parallel to each other in the Y direction. Fourth, fifth and sixth photodiodes 130YA, 130YB and 130YC are arranged in a column in the Y direction with the fifth photodiode between the fourth and sixth photodiodes. P-doped regions 135 and N-doped regions 140 of fourth, fifth and sixth photodiodes 130YA, 130YB and 130YC longitudinal axes parallel to each other in the Y direction.

Each of first, second, third, fourth, fifth and sixth LEDs 125XA, 125XB, 125XC, 125YA, 125YB and 125YC emit light of a different wavelength, so six different LEDs types are required, while only one photodiode type is required. The sixth wavelengths emitted by the first, second, third, fourth, fifth and sixth LEDs 125XA, 125XB, 125XC, 125YA, 125YB and 125YC are different from the wavelength of light used to activate first, second, third, fourth, fifth and sixth photodiodes 130XA, 130XB, 130XC, 130YA, 130YB and 130YC. The wavelength of light used to activate first, second, third, fourth, fifth and sixth photodiodes 130XA, 130XB, 130XC, 130YA, 130YB and 130YC may be the same as the wavelength used to expose a photoresist layer formed on the wafer containing first and second sets of alignment monitors 120X and 120Y or a wavelength that the photoresist layer is not sensitive to. In one example, the wavelength of light used to expose the photoresist layer is less than or equal to 193 nm. In one example, the wavelength of light used to expose the photoresist layer is 157 nm. In one example, first, second, third, fourth, fifth and sixth LEDs 125XA, 125XB, 125XC, 125YA, 125YB and 125YC emit light in the range of about 430 nm to about 940 nm. The emission wavelength of LEDs can be controlled by varying the forward bias voltage (which may require a voltage adjustment circuit between the photodiode and the LED in the embodiments of the present invention) and/or by selection of the LED dye material (and concentration) as illustrated in TABLE II.

TABLE II

| Wavelength (nm) | Voltage (V) | Dye Material |
| --- | --- | --- |
| 940 | 1.5 | GaAlAs/GaAs |

TABLE II-continued

| Wavelength (nm) | Voltage (V) | Dye Material |
| --- | --- | --- |
| 880 | 1.7 | GaAlAs/GaAs |
| 850 | 1.7 | GaAlAs/GaAs |
| 660 | 1.8 | GaAlAs/GaAs |
| 635 | 2.0 | GaAsP/GaAs |
| 633 | 2.2 | InGaAlP |
| 620 | 2.2 | InGaAlP |
| 612 | 2.2 | InGaAlP |
| 605 | 2.1 | GaAsP/GaP |
| 595 | 2.2 | InGaAlP |
| 592 | 2.1 | InGaAlP |
| 585 | 2.1 | GaAsP/GaP |
| 574 | 2.4 | InGaAlP |
| 570 | 2.0 | InGaAlP |
| 565 | 2.1 | GaP/GaP |
| 560 | 2.1 | InGaAlP |
| 555 | 2.1 | GaP/GaP |
| 525 | 3.5 | SiC/GaN |
| 505 | 3.5 | SiC/GaN |
| 470 | 3.6 | SiC/GaN |
| 430 | 3.8 | SiC/GaN |

Figure 9:
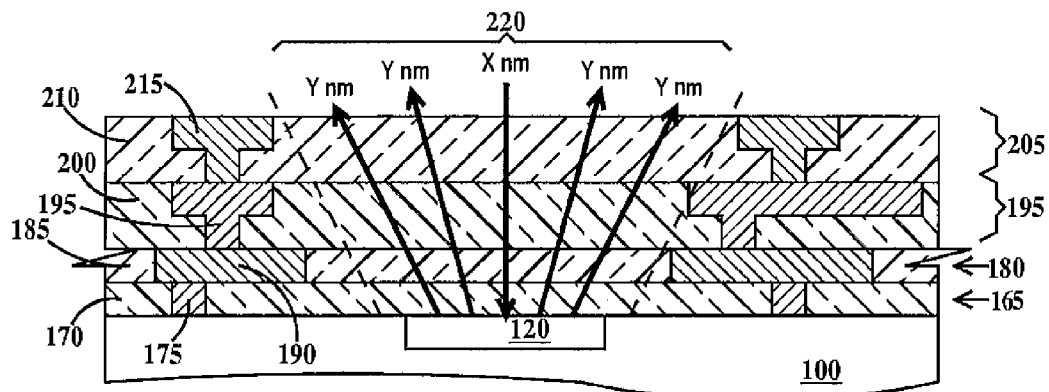
FIGS. 9, 10 and 11 are cross-sectional views of alignment structures according to the present invention formed in integrated circuits during fabrication of the integrated circuit.
Figure 10:
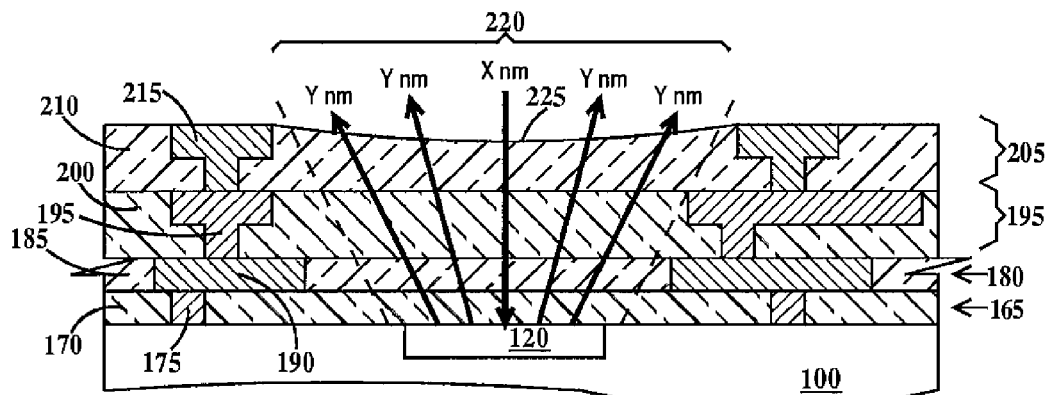
Figure 11:
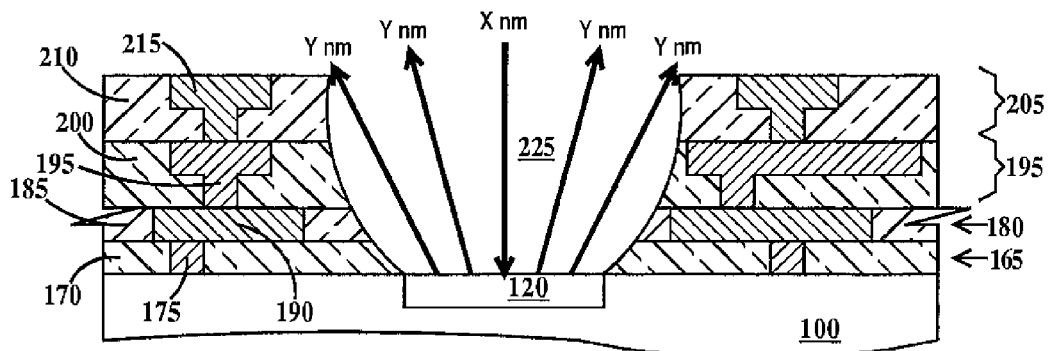

FIGS. 9, 10 and 11 are cross-sectional views of alignment structures according to the present invention formed in integrated circuits during fabrication of the integrated circuit. In FIGS. 9, 10 and 11, exemplary alignment monitor 120 (see FIG. 2 and supra for more details) is formed in wafer 100 and a first interconnect level (not shown) is formed over wafer 100 and alignment monitor 120. In the example of FIGS. 9, 10 and 11, the first wiring level (not shown) is used to form and electrically connect the photodiodes and LEDs of alignment monitor 120. The first interconnect level is the level having polysilicon interconnects. A second interconnect level 165 including a dielectric layer 170 and damascene metal contacts 175 is formed over the first interconnect level. A third interconnect level 180 including a dielectric layer 180 and damascene metal wires 190 is formed on a top surface of second interconnect level 165. A fourth interconnect level 195 including a dielectric layer 200 and dual damascene metal wires 205 is formed on a top surface of third interconnect level 180. A fifth interconnect level 205 including a dielectric layer 210 and dual damascene metal wires 215 is formed on a top surface of fourth interconnect level 195.

A damascene process is one in which wire trenches or via openings are formed in a dielectric layer, an electrical conductor of sufficient thickness to fill the trenches is formed on a top surface of the dielectric, and a chemical-mechanical-polish (CMP) process is performed to remove excess conductor and make the surface of the conductor co-planar with the surface of the dielectric layer to form damascene wires (or damascene vias). When only a trench and a wire (or a via opening and a via) is formed the process is called single-damascene.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is formed on a top surface of the dielectric and a CMP process is performed to make the surface of the conductor in the trench co-planar with the surface the dielectric layer to form dual-damascene wires and dual-damascene wires having integral dual-damascene vias.

A region 220 of interconnect levels 165, 180, 195 and 205 contains no wires or contacts so as to not block incident light Xnm striking the photodiode of monitor 120 as well as to not block emitted light Ynm from the LED of alignment monitor 120. Emitted light Ynm is not highly directional and spreads over a wide arc as it is emitted. In one example incident light Xnm is incident at an angle of about 90° to the top surface of wafer 100. In one example, emitted light Ynm is emitted at an angle within about 15° from the incident angle of incident light Xnm.

As illustrated in FIGS. 9, 10 and 11, wafer 100 is ready for fabrication of a next BEOL fabrication level above fourth interconnect level 205. In one example, this would involve forming a new dielectric layer on a top surface of dielectric layer 210, forming a photoresist layer on the top surface of the new dielectric layer and patterning the photoresist layer in a photolithography tool as illustrated any of FIG. 12, 13, 14, 15 or 16 and described infra.

In FIG. 9, a top surface of fourth dielectric layer 210 is planar and parallel to a top surface of wafer 100. In FIG. 10, the top surface of fourth dielectric layer 210 in region 220 is dished downward toward wafer 100 in region 220. In FIG. 11, an opening 225 is formed in interconnect levels 165, 180, 195 and 205 over alignment monitor 120 so as to not attenuate incident light Xnm or emitted light Ynm. It is believed at the current state of the art of photodiodes and LEDs that a photodiode area of about 900 square microns (e.g., about 30 microns by 30 microns) will generate about 1 microampere of current which would cause the LED to emit at a high enough intensity to be easily detected.

It should be understood that the interconnect levels used to electrically connect the photodiodes and the LEDs of the alignment monitors may be formed in any level below that the monitors are intended to monitor alignment for and regions 220 of FIGS. 9 and 10 and opening 225 of FIG. 11 correspondingly adjusted.

Figure 12:
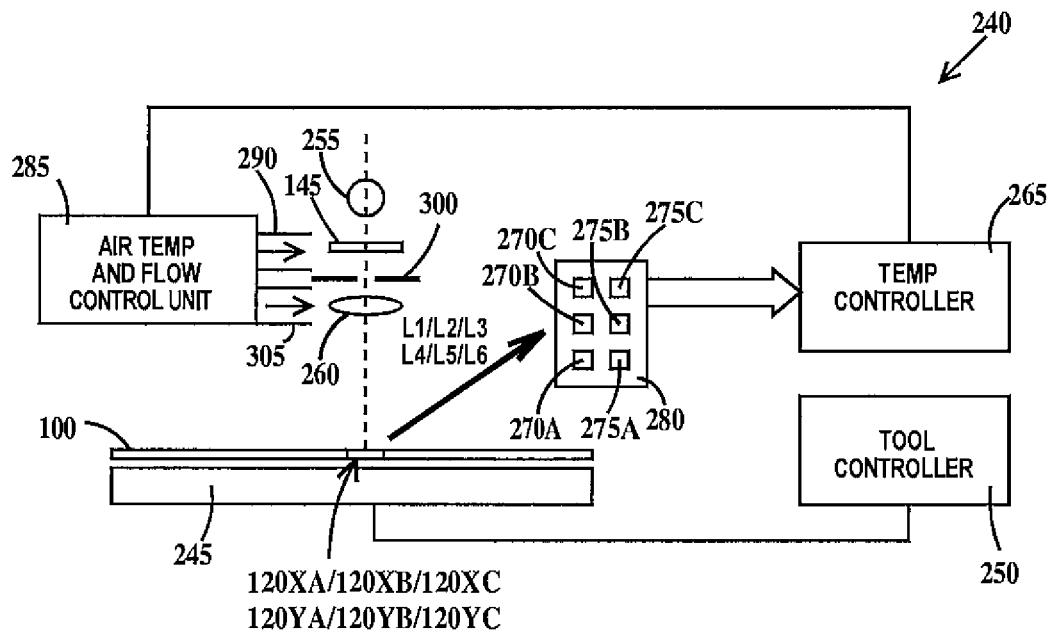
FIG. 12 is schematic diagram of a first optical photolithography system according to embodiments of the present invention.

FIG. 12 is schematic diagram of a first optical photolithography system according to embodiments of the present invention. In FIG. 12, a photolithography system 240 includes a X-Y-θ stage 245, a system controller 250, a light source 255, a lens 260, a temperature controller 265, X-alignment photo detectors (e.g., photodiodes) 270A, 270B and 270C and Y-alignment photo detectors 275A, 275B and 275C on a mounting bracket 280, and an air temperature and flow control unit 285 having means 295 for directing filtered air (or other filtered gas) at a determined temperature onto photomask 195 at a determined flow rate, and a opening adjustable and/or moveable slit 300. Photolithography system 240 also includes means (not shown) for holding photomask 145 and means (not shown) for aligning alignment targets on substrate 100 to alignment marks on photomask 145. Light from light source 255 passes through clear regions in photomask 145, slit 300 and lens 260 onto a layer of photoresist (not shown) on wafer 100. Light source 255 emits light of a wavelength that causes photochemical reaction in the photoresist layer. X-alignment photo detectors 270A, 270B and 270C detect light at the wavelengths emitted by X-alignment monitors 120XA, 120XB and 120XC respectfully and Y-alignment photo detectors 275A, 275B and 275C detect light emitted by Y-alignment monitors 120YA, 120YB and 120YC respectfully. In one example, X-alignment photo detectors 270A, 270B and 270C and Y-alignment photo detectors 275A, 275B and 275C include photodiodes each having a different bandpass filter to limit the range of wavelengths impinging on each photo detector to a respective range of wavelengths emitted by a corresponding X-alignment monitors 120XA, 120XB and 120XC or Y-alignment monitors 120YA, 120YB and 120YC.

In operation, stage 245 steps wafer 100 under lenses 270 with the slit closed. The slit opening is opened and light to expose just the photodiodes of X-alignment monitors 120XA, 120XB and 120XC and the photodiodes of Y-alignment monitors 120YA, 120YB and 120YC to light from light source 255. Based on the intensity of the signals from photo detectors 270A, 270B, 270C, 275A, 275B and 275C, temperature controller 265 directs air temperature and flow control unit 280 to blow filtered air (or other filtered gas) at a determined temperature and flow rate over photomask 195 until signals from photo detectors 270A, 270B, 270C, 275A, 275B and 275C reach predetermined values. At this point the photomask is in thermal equilibrium. Depending upon the location of X-alignment monitors 120XA, 120XB and 120XC and Y-alignment monitors 120YA, 120YB and 120YC relative to each other and active regions of the integrated circuit chip 105 (see FIG. 2), slit 300 may comprise two independently controlled slits, a first slit for exposing X-alignment monitors 120XA, 120XB and 120XC to light from light source 255 and a second slit for exposing Y-alignment monitors 120YA, 120YB and 120YC to light from light source 255. After the signal received from photo detectors 270A, 270B, 270C, 275A, 275B and 275C indicate a desired level of mask to wafer alignment has been achieved, and mask 145 aligned to wafer 100 using conventional photomask to wafer alignment means under the control of system controller 250, slit 300 is adjusted as needed for normal exposures of the integrated circuit chip.

Photolithography system 240 may be a step and expose system or a step and scan system. In a step and expose system, stage 245 moves wafer 100 under photomask 145, slit 300 opened to expose a full integrated circuit chip (or multiple chips and after exposure is complete the stage moves the wafer to a new location and the process repeats. In a step and scan system, after stage 245 moves the wafer under photomask 145 slit 300 is opened to a size less than the full size of the integrated circuit chips (or chips) and slit 300 is scanned across photomask 145 to expose wafer 100 to less than whole portions of photomask 145 at any given instant of time. Then stage 245 steps wafer 100 to a new location and the process repeats. Optionally system 240 may be provided with a means 305 for directing air over lens 260 at a predetermined temperature and predetermined flow rate until signals from photo detectors 270A, 270B, 270C, 275A, 275B and 275C reach predetermined values. The temperature of photomask 145 and lens 260 may be controlled to the same temperature or different temperatures.

Figure 13:
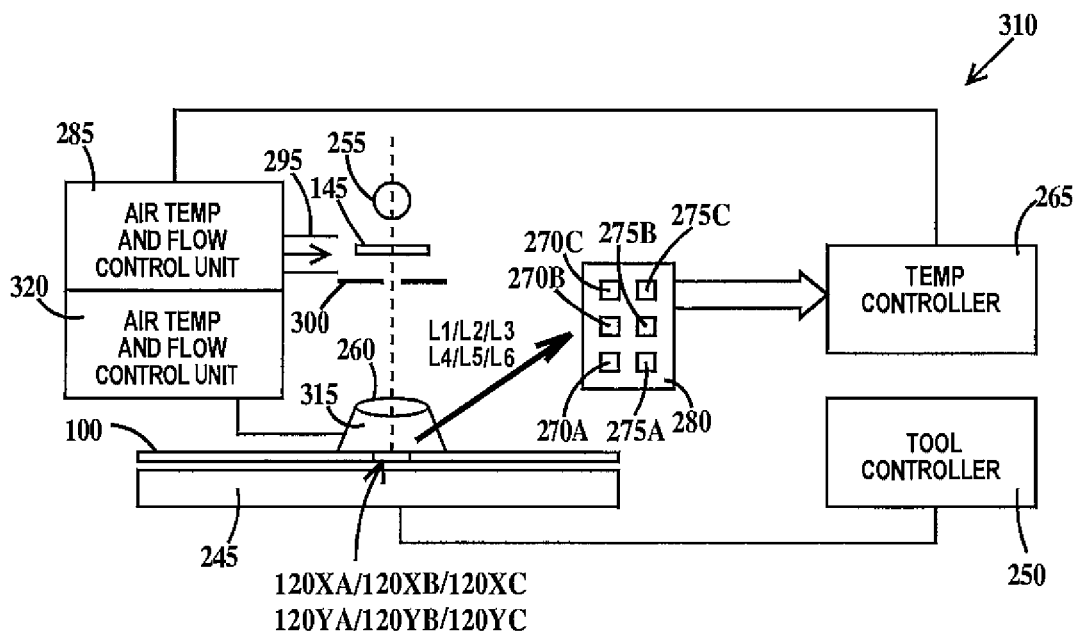
FIG. 13 is schematic diagram of a second optical photolithography system according to embodiments of the present invention.

FIG. 13 is a schematic diagram of a second optical photolithography system according to embodiments of the present invention. In FIG. 13 an immersion photolithography system 310 is similar to photolithography too 240 of FIG. 12, except an immersion head 315 contains lens 260 and an immersion fluid (e.g., water) fills the space between the lens and the top surface of wafer 100 and a fluid temperature and flow control unit 320 for control of the immersion fluid temperature (and thus lens 260 temperature) is provided. Immersion photolithography system may be a step and expose or a step and scan system. The temperature of photomask 145 and lens 260 may be controlled to the same temperature or different temperatures.

Figure 14:
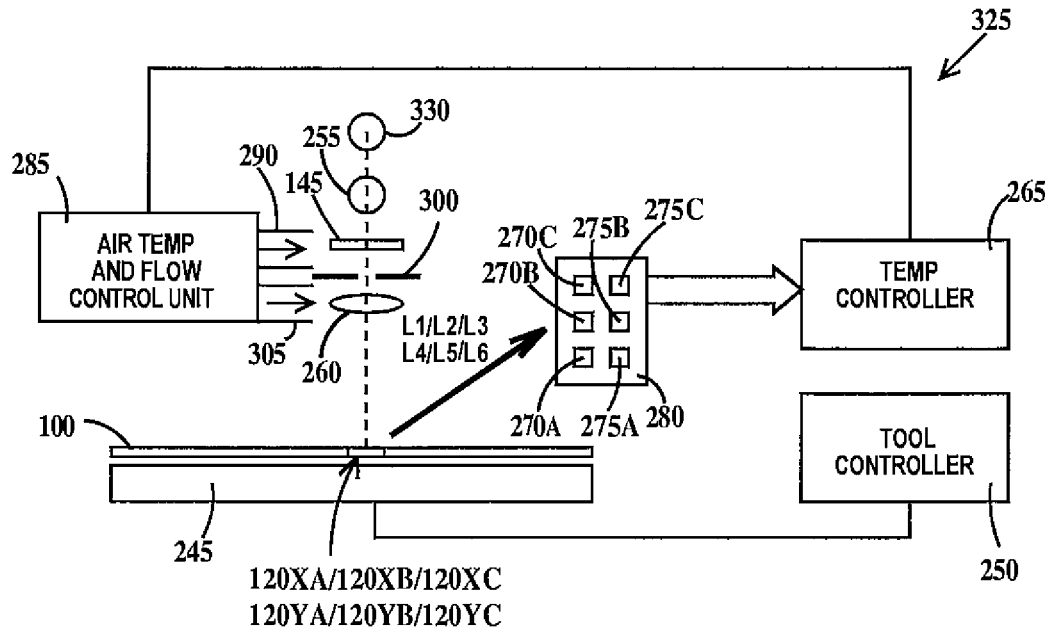
FIG. 14 illustrates a first option that may be applied to the first and second optical photolithography systems.

FIG. 14 illustrates a first option that may be applied to the first and second optical photolithography systems. The first option will be described using photolithography system 240 of FIG. 12 as an example. In FIG. 14, a photolithography system 325 is similar to photolithography system 240 of FIG. 12 except an additional light source 330 is supplied and positioned to direct light from light source 330 through mask 145, slit 300 and lens 260 onto the photodiodes of X-alignment monitors 120XA, 120XB and 120XC and the photodiodes of Y-alignment monitors 120YA, 120YB and 120YC. Light source 330 may be a separate light source from 255 or combined within light source 255. With separate light sources an optical system is provided to direct light from either light source 255 or light source 330 onto the optical path indicated by the dashed lines. The light from light source 330 will not cause photochemical reactions in the photoresist layer (not shown) while the light from light source 255 will. Photolithography system 325 may be a step and expose system or a step and scan system. While the wavelength of light produced by light source 330 is a wavelength that the photoresist applied to wafer 100 is not sensitive to (i.e., it is non-actinic radiation relative to the photoresist), the wavelength is one that photodiodes of X-alignment monitors 120XA, 120XB and 120XC and Y-alignment monitors 120YA, 120YB and 120YC will absorb and convert to current flow.

In operation, stage 245 steps wafer 100 under lenses 270 and light from light source 330 is directed to the photodiodes of X-alignment monitors 120XA, 120XB and 120XC and Y-alignment monitors 120YA, 120YB and 120YC. Based on the intensity of the signals from photo detectors 270A, 270B, 270C, 275A, 275B and 275C, temperature controller 265 directs air temperature and flow control unit 280 to blow filtered air (or other filtered gas) at a determined temperature and flow rate over photomask 195 until signals from photo detectors 270A, 270B, 270C, 275A, 275B and 275C reach predetermined values. At this point the photomask is in thermal equilibrium, and normal photoresist exposure as described supra in reference to photolithography system 240 of FIG. 12 is performed.

Figure 15:
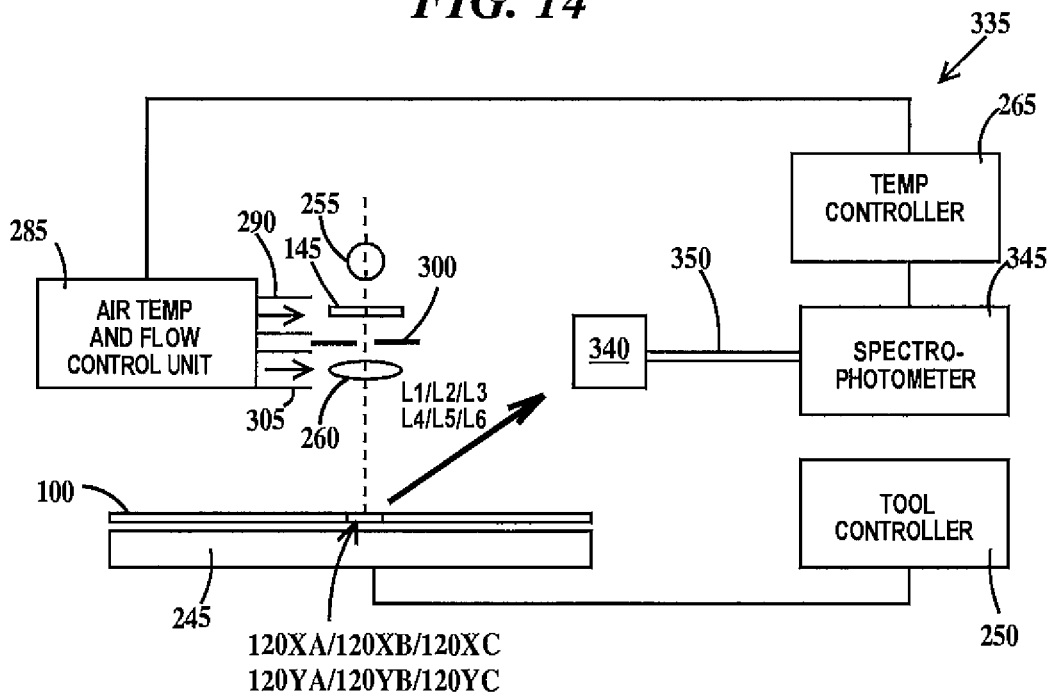
FIG. 15 illustrates a second option that may be applied to the first and second optical photolithography systems.

FIG. 15 illustrates a second option that may be applied to the first and second optical photolithography systems. The second option will be described using photolithography system 240 of FIG. 12 as an example. In FIG. 15, a photolithography system 335 is similar to photolithography system 240 of FIG. 12 except X-alignment photo detectors 270A, 270B and 270C and Y-alignment photo detectors 275A, 275B and 275C on a mounting bracket 280 of FIG. 12 have been replaced with optical assembly 340 connected to a spectrophotometer 345 by an optical cable 350. Spectrophotometer 345 is configured to analyze the intensity of various wavelength bands within the signal transmitted from optical assembly 345. In one example, optical assembly 345 is a lens. Operation of photolithography system 335 is similar to that of photolithography system 240 of FIG. 12. An exemplary spectrophotometer is described in U.S. Pat. No. 5,305,233 to Kawagoe et al., issued Apr. 19, 1994, which is hereby incorporated by reference in its entity.

Figure 16:
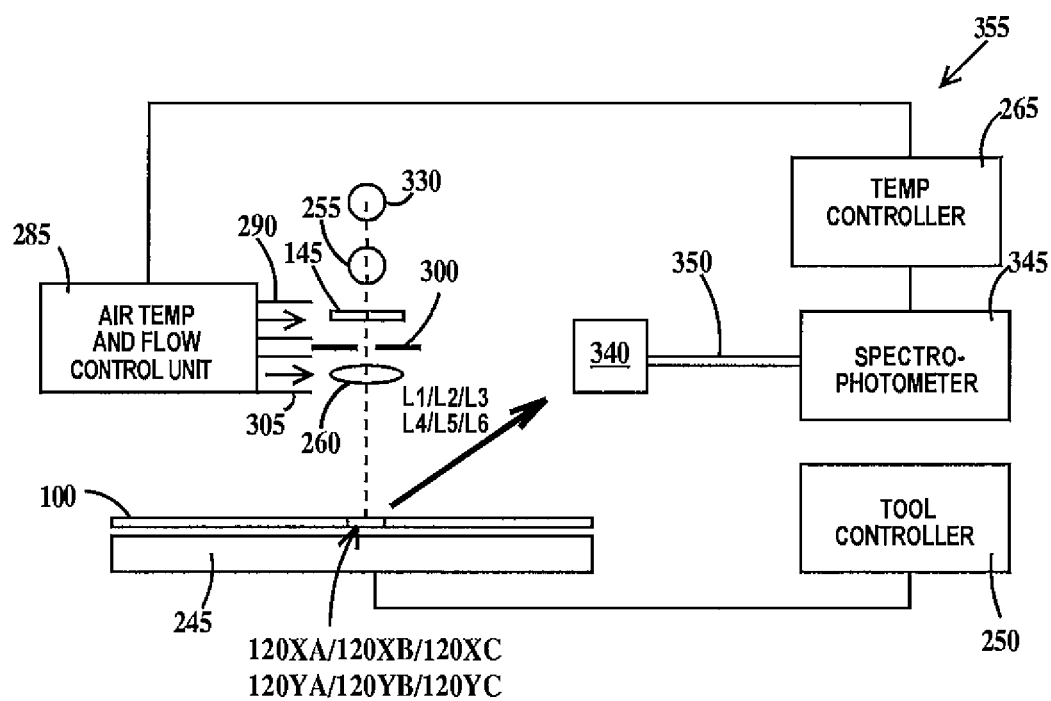
FIG. 16 illustrates that both the first and second option may be applied to the first and second optical photolithography systems.

FIG. 16 illustrates that both the first and second option may be applied to the first and second optical photolithography systems. The second option will be described using photolithography system 335 of FIG. 15 as an example. In FIG. 16, a photolithography system 355 is similar to photolithography system 335 of FIG. 15 except additional light source 330 is supplied. Photolithography system 355 may be a step and expose system or a step and scan system. The operation of photolithography system 355 is similar to that of photolithography system 325 of FIG. 14.

In FIGS. 12, 13, 14, 15 and 16, in one example, photomask 145 is comprised of $SiO_2$ (not transmissive below 193 nm, coefficient of thermal expansion of 0.5 ppm PC), $SiFO_2$ (not transmissive below 157 nm) or $CaF_2$ (transmissive below 157 nm, coefficient of thermal expansion of 14 ppm PC). In one example, lens 260 and the wafer of photomask 145 are comprised of the same material (e.g., both are $SiO_2$, $SiFO_2$ or $CaF_2$). While useful when the photomask and/or lens comprise $SiO_2$, the embodiments of the present invention are of particular usefulness when the lens and/or photomask comprise materials having high (e.g., greater than about 0.5 ppm/° C.) coefficients of thermal expansion as the amount of expansion of the mask and/or lens can be controlled to same value regardless of room ambient temperature.

Wafers are coated with photoresist prior to being placed in the exposure system. After the photomask or photomask and lens temperatures are adjusted as described supra, the photomask and wafer are aligned and the photo resist is exposed to actinic radiation through a patterned photomask and the latent image produced developed to define a pattern in the photoresist corresponding to a fabrication level of an integrated circuit chip. Then etching/or ion implanting the wafer is performed followed by removal of the patterned photoresist layer.

Thus the present invention provides a method of monitoring and controlling photomask to wafer alignments compatible with sub-193 nm photolithography (e.g., 157 nm and lower). However, the embodiments of the present invention may be used with wavelengths of 193 or lower.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, while the present invention is directed to sub-193 nm photolithography, the invention may be practiced with supra-193 nm photolithography. Additionally the embodiments of the present invention may be practiced on substrates having a different geometry than wafers, such as rectangular substrates or wafers comprising other semiconductor materials such as germanium, sapphire and gallium. Therefore, it is intended that the following claims cover all such modifications and changes as fall within the true spirit and scope of the invention.

What is claimed is:

1. An apparatus, comprising:
   an X-Y-θ stage configured to hold a semiconductor substrate;
   a light source;
   a lens;
   a mask holder configured to hold a photomask between said light source and lens;
   a slit between said mask holder and said lens;
   means for aligning a set of alignment targets on said semiconductor substrate to a corresponding set of alignment marks on said photomask, said alignment target of said set of alignment targets comprising at least one light emitting diode and a corresponding array of photodiodes;
   means for directing incident light onto said set of alignment targets;
   means for measuring intensities of light, emitted from said one or more light emitting diodes; and
   a sub-system configured to direct temperature controlled gas over said photomask based on signals received from said means for measuring intensities of light.

2. The apparatus of claim 1, further including:
   a fluid filled immersion head between said lens and a top surface of said substrate.

3. The apparatus of claim 2, further including means for adjusting a temperature of said fluid based on said signals received from said means for measuring intensities of light.

4. The apparatus of claim 1, wherein each light emitting diode of each alignment mark of said set of alignment marks emits light of a different wavelength; and wherein said means for measuring intensities of light comprises an array of photo detectors, each photo detector of said array of photo detectors configured to measure a different range of wavelengths.

5. The apparatus of claim 1, wherein each light emitting diode of each alignment mark of said set of alignment marks emits light of a different wavelength; and wherein said means for measuring intensities of light comprises a spectrophotometer configured to measure light intensities in different wavelength ranges.

6. The apparatus of claim 1, wherein said means for measuring intensities of light comprises an array of photo detectors.

7. The apparatus of claim 1, wherein said means for measuring intensities of light comprises a spectrophotometer.

8. An apparatus, comprising:
- an X-Y-θ stage configured to hold a semiconductor substrate;
- a light source;
- a lens;
- a mask holder configured to hold a photomask between said light source and lens;
- a slit between said mask holder and said lens;
- means for aligning a set of alignment targets on said semiconductor substrate to a corresponding set of alignment marks on said photomask, said alignment target of said set of alignment targets comprising at least one light emitting diode and a corresponding array of photodiodes;
- means for directing incident light onto said set of alignment targets;
- means for measuring intensities of light, emitted from said one or more light emitting diodes; and
- a sub-system configured to direct temperature controlled gas over said lens based on said signals received from said means for measuring intensities of light.

9. The apparatus of claim 8, further including:
- a fluid filled immersion head between said lens and a top surface of said substrate.

10. The apparatus of claim 9, further including means for adjusting a temperature of said fluid based on said signals received from said means for measuring intensities of light.

11. The apparatus of claim 8, wherein each light emitting diode of each alignment mark of said set of alignment marks emits light of a different wavelength; and wherein said means for measuring intensities of light comprises an array of photo detectors, each photo detector of said array of photo detectors configured to measure a different range of wavelengths.

12. The apparatus of claim 8, wherein each light emitting diode of each alignment mark of said set of alignment marks emits light of a different wavelength; and wherein said means for measuring intensities of light comprises a spectrophotometer configured to measure light intensities in different wavelength ranges.

13. The apparatus of claim 8, wherein said means for measuring intensities of light comprises an array of photo detectors.

14. The apparatus of claim 8, wherein said means for measuring intensities of light comprises a spectrophotometer.

15. An apparatus, comprising:
- an X-Y-θ stage configured to hold a semiconductor substrate;
- a light source;
- a lens;
- a mask holder configured to hold a photomask between said light source and lens;
- a slit between said mask holder and said lens;
- means for aligning a set of alignment targets on said semiconductor substrate to a corresponding set of alignment marks on said photomask, said alignment target of said set of alignment targets comprising at least one light emitting diode and a corresponding array of photodiodes;
- means for directing incident light onto said set of alignment targets;
- means for measuring intensities of light, emitted from said one or more light emitting diodes; and
- a sub-system configured to direct temperature controlled gas over both said photomask and said lens based on said signals received from said means for measuring intensities of light.

16. The apparatus of claim 15, further including:
- a fluid filled immersion head between said lens and a top surface of said substrate.

17. The apparatus of claim 16, further including means for adjusting a temperature of said fluid based on said signals received from said means for measuring intensities of light.

18. The apparatus of claim 15, wherein each light emitting diode of each alignment mark of said set of alignment marks emits light of a different wavelength; and wherein said means for measuring intensities of light comprises an array of photo detectors, each photo detector of said array of photo detectors configured to measure a different range of wavelengths.

19. The apparatus of claim 15, wherein each light emitting diode of each alignment mark of said set of alignment marks emits light of a different wavelength; and wherein said means for measuring intensities of light comprises a spectrophotometer configured to measure light intensities in different wavelength ranges.

20. The apparatus of claim 15, wherein said means for measuring intensities of light comprises an array of photo detectors.

21. The apparatus of claim 15, wherein said means for measuring intensities of light comprises a spectrophotometer.

* * * * *